United States Patent [19]

Scrantom et al.

[11] Patent Number: 4,561,954
[45] Date of Patent: Dec. 31, 1985

[54] METHOD OF APPLYING TERMINATIONS TO CERAMIC BODIES

[75] Inventors: Dehart G. Scrantom, Sunset Beach, N.C.; Lonnie Hopkins, Colorado Springs, Colo.

[73] Assignee: AVX Corporation, Great Neck, N.Y.

[21] Appl. No.: 693,173

[22] Filed: Jan. 22, 1985

[51] Int. Cl.⁴ ............................................. C23C 15/00
[52] U.S. Cl. ................................ 204/192 R; 29/25.42
[58] Field of Search ............................ 204/192 R, 298; 29/25.41, 25.42

[56] References Cited

U.S. PATENT DOCUMENTS 3,257,305 6/1966 Varga ........................... 29/25.42 X
3,809,973 5/1974 Hurley ............................ 29/25.42 X
3,992,761 11/1976 McElroy et al. ................. 29/25.42
4,379,743 4/1983 Nakatsukasa et al. .............. 204/298

Primary Examiner—G. L. Kaplan
Attorney, Agent, or Firm—Arthur B. Colvin

[57] ABSTRACT

A method of terminating a multilayer ceramic capacitors and like electronic components is disclosed. In accordance with the method the capacitors are loaded into apertures formed in an elastomeric mask such that only the surface portions to be metalized are exposed. In advance of loading, the surfaces of the mask are pre-coated, preferably by a sputtering procedure, so as to preclude "out-gasing" of the mask material during sputtering.

5 Claims, 8 Drawing Figures

METHOD OF APPLYING TERMINATIONS TO CERAMIC BODIES

BACKGROUND OF THE INVENTION

1. Field Of The Invention

This invention relates to a method of applying terminations to the opposed ends of ceramic bodies, and more particularly to a method of applying terminations to a multiplicity of ceramic capacitors in a single operation.

2. The Prior Art

Multilayer ceramic capacitors (MLC) typically comprise a plurality of layers of ceramic dielectric having electrode layers interposed between the ceramic layers. Typically, alternate electrode layers are exposed at opposite ends of the ceramic monolith. Typical examples of MLC's of the type described may be found in one or more of the following U.S. Pat. No. 3,004,197 Oct. 10, 1961 and U.S. Pat. No. 3,235,939 Feb. 29, 1966. After the capacitors are formed it is necessary to apply terminations to the exposed electrode portions so as to permit the capacitor to be readily connected to a printed circuit board or the like.

In the typical procedure of manufacturing an MLC, termination is effected by applying to the ends of the ceramic monolith having exposed electrodes, a paste which comprises low melt glass frit and conductive material, typically silver. The capacitor is thereafter heated to drive off solvents and/or binders to fuse the glass material and cause the silver component to make contact with the exposed areas of the metallic electrodes.

The thus terminated capacitors may thereafter have leads soldered to them.

The described method incorporates a number of drawbacks, including the relatively high electrical resistance of the terminating compound, the relative fragility of the compound, the possibility that the terminating material may not form an electrical connection to one or more of the electrode layers, the requirement of reheating the entire capacitor to effect melting of the frit components, the relatively high cost of silver necessarily included in the termination compound, and the difficulty of applying the termination paste accurately to the end portions of the capacitors which may in some instance be an eighth of an inch in dimension or less.

It is heretofore been proposed, in accordance with U.S. Pat. No. 3,992,761, to terminate capacitors by a plating operation. In accordance with the teaching of the last mentioned patent a multiplicity of capacitors are imbedded in a plastic block with the edge portions having exposed electrodes extending transversely of the block. Portions of the block are dissolved away, following which the block is immersed in a plating solution. When sufficient metal has been deposited over the end portions of the capacitors to effect electrical connections to the electrodes of the capacitors, the block is removed, the platic components dissolved away, and conductive leads are applied to the metalized end portions of the capacitors.

It has been proposed to effect termination by a vacuum deposition method know generally in the trade as sputtering. The sputtering process is advantageous in that through the process it is possible to deposit extremely thin layers of metallic material, with the assurance that all portions subjected to the metal deposition procedure will be intimately engaged by the deposited metal and thus all layers of the capacitor are contacted by the termination material.

A difficulty inherent in sputter application of termination materials, resides in the fact that deposited increments of metal will be received by all exposed portions of the capacitors. Thus, unless the side faces of the capacitor, i.e. the faces between the ends to which termination is to be effected, are not completely shielded from the sputtering operation, there is substantial likelihood for the formation of a shorting band or film of sputtered material extending between the end portions of the capacitor with resultant shunting or short-circuiting of the capacitor.

In order to render a sputtering procedure feasible as a means of terminating capacitors, it is imperative, for an economic operation, that hundreds or even thousands of capacitors be simultaneously treated. While conceptually, a sputtering operation could be simultaneously effected on a multiplicity of capacitors imbedded in a cast plastic block or the like as suggested in the above referenced U.S. Pat. No. 3,992,761, the difficulties in aligning the capacitors, casting of the block, removal of the surface portions of the block to expose the terminal ends of the capacitors etc. and dissolution of the block after sputter applications, would render such method impracticable. While it is likewise theoretically possible to effect sputter termination by fitting a multiplicity of capacitors into a specially formed metallic jig or die which so closely embraces the sides of the capacitors as to preclude the formation of a shunting band of sputtered material during metal deposition, the fabrication and loading of a die of such precise dimensions capable of handling large quantities of capacitors at a single run renders such method commercially useless.

Attempts have been made to effect a sputtering operation while shielding the portions of the capacitors which are to remain free of sputtered material by implanting the capacitors in an elastomeric block or slab having throughgoing apertures sized to intimately engage side portions of the capacitors while exposing their ends.

It has been discovered, however, that while such elastomeric material forms an adequate shield, such material tends to "out-gas" in the course of the sputtering operation which is necessarily carried out under vacuum conditions. The result of such "out-gasing" is the formation at the interface between the deposited sputtered material and the capacitors, of glassy increments or inclusions. The increments or inclusions result in insulating one or more of the layers of the capacitor from the sputtered material with the result that the capacitive value of the terminated device cannot be accurately predicted.

SUMMARY OF THE INVENTION

The present invention may be summarized as directed to an improved method of terminating MLC's by a sputtering process. In accordance with the method, a multiplicity of MLC's to be terminated are loosely arranged in transversely extending apertures formed in a metal load plate or block. An elastomeric mask is provided, the mask having a thickness which approximates the end to end dimension of the MLC's. The apertures in the mask are positioned complementally to exit apertures of the load plate within which the capacitors are positioned. The capacitors are forced from the load plate into the complementally disposed apertures of the mask in such manner that opposed ends of the capacitors are exposed at opposite surfaces of the mask.

As will be made apparent from the ensuing description the end portions may optionally project slightly beyond the opposed surfaces of the mask, may be flush with the mask, or may be slightly recessed from the surface of the mask.

The characterizing feature of the invention resides in the step and concept of sputter coating the opposed surfaces of the elastomeric mask with a layer or layers or metal in advance of loading of the mask. The metal is deposited to a thickness which will not materially reduce the stretchability of the elastomeric mask. It is thus possible to slightly deform the mask as the capacitors are pressed from the load plate into the interior of the apertures of the mask. The surface plated and filled elastomeric mask is next secured within a jig or frame which encompasses the side borders of the mask.

The resultant fixture comprising the frame and filled and plated mask may thereafter be subjected to a sputtering operation or operations on the opposed surfaces thereof, which operation will result in the application of a conductive layer or layers of metal over the exposed ends of the capacitors, and in addition over the metalized portions of the mask.

After completion of the sputtering operation the capacitors are removed from the mask, following which such additional conventional operations may be effected on the capacitors as is desired.

In accordance with the invention there is thus provided a method for readily masking capacitors to enable the application of sputter terminations through the use of an elastomeric mask which is rendered resistant to "out-gasing" as the result of the prior application to the mask of a sputtered layer or layers which nonetheless leave the mask sufficiently deformable to permit capacitors to be bodily shifted from a load plate into complemetally positioned apertures formed in the mask.

It is accordingly an object of the invention to provide a new and useful method of applying sputter terminations to capacitors or to like electronic components.

A further object of the invention is the provision of a method for terminating MLC's or the like by a sputtering procedure which method includes the step of providing an elastomeric mask having apertures sized to receive the components intimately and thus prevent sputtered material from engaging the sides, forming a metal coating over the exposed surfaces of the elastomeric mask, thereafter filling the throughgoing apertures of the mask with components to be sputtered while leaving the end portions of the components exposed at a surface or surfaces of the mask, and thereafter subjecting the exposed surface or surfaces defined by the mask and the exposed portions or the components to a sputtering step.

In order to attain these objects and such other objects as may appear herein or be pointed out hereinafter, reference is made to the accompanying drawings in which.

Figure 4:
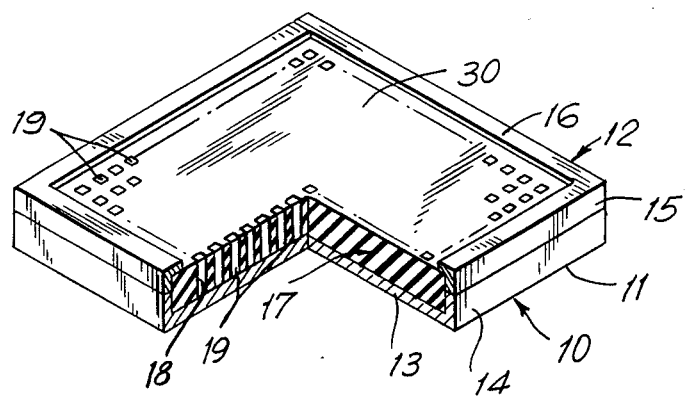
FIG. 4 is a perspective view on a smaller scale of the filled jig or frame assembly ready to be introduced into the sputtering apparatus, with portions of the apparatus cut-away to show interior detail.

Referring now to the drawings, there is disclosed in FIG. 4 a perspective view of a fixture adapted to be introduced into a sputtering apparatus, the fixture including a frame 10 including a bottom frame portion 11 and an upper frame component 12. The bottom frame 11 comprises a base portion 13 and a surrounding side wall portion 14. The upper frame component 12 includes side wall portion 15 and inwardly directed lip portion 16. The frame assembly 10 encompasses a mask 17 formed of an elastomeric material, a preferred elastomer being sold under the registered trademark SILASTIC and manufactured by the Dow Corning Corporation of Midland, Mich.

SILASTIC comprises a silicone rubber, a preferred grade for the noted application being identified as J RTV Silicone Rubber. Alternate silicone rubber compositions may be used, the specifically identified composition being set forth herein for purposes of compliance with the requirements of the patent laws.

Figure 1:
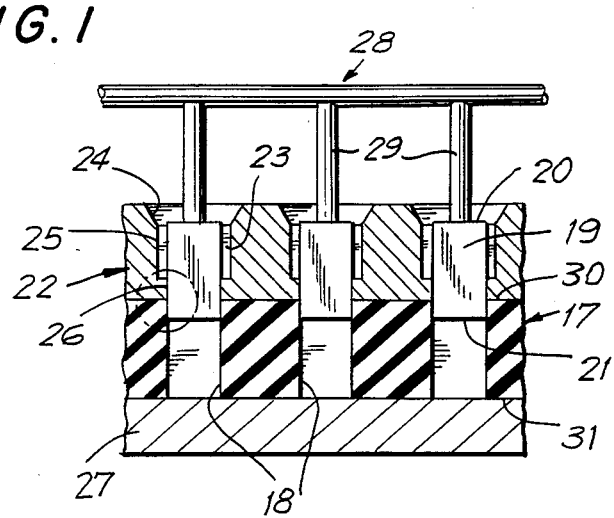
FIG. 1 is a diagrammatic fragmentary sectional view of portions of the loading mechanism and mask during initial stages of loading of capacitors into the mask.
Figure 2:
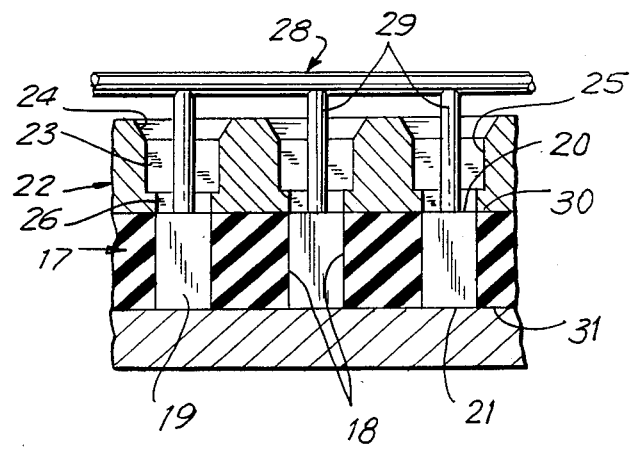
FIG. 2 is a section similar to FIG. 1 showing the position of the loading assembly components after the capacitors have been inserted into position within the mask member.
Figure 3:
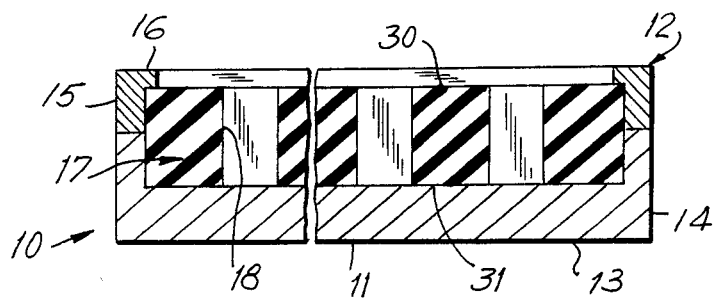
FIG. 3 is a fragmentary sectional view of the mask inserted in a jig or frame adapted to be introduced into the sputtering apparatus.

The mask member 17 as best seen in FIGS. 1, 2 and 3, is provided with a multiplicity of throughgoing apertures 18 of a size to intimately embrace the capacitors 19 which are to be terminated at their opposed ends 20 and 21.

As will be understood by those skilled in the art relating to MLC devices, the capacitors 19 are manufactured in a manner which causes the electrodes of opposite polarities to be exposed at one or the other of the end faces 20 or 21. It is the function of a termination to connect in parallel all of the electrodes of a given polarity, the termination also functioning to provide an anchor point for leads or the like whereby the capacitor may be introduced into an electrical circuit.

In FIGS. 1 and 2 there is diagrammatically disclosed an apparatus for effecting the introduction of the capacitors into the throughgoing apertures 18 formed in the mask 17.

It will be appreciated that for economical manufacture each mask may desirably include thousands of apertures. In order to facilitate filling of the multiple apertures of the mask there is provided a load plate 22 which is provided with a multiplicity of apertures 23 corresponding in number and position with the apertures 18 of the mask 17. The apertures 23 of the load plate include tapered or funnel like lead portions 24 of a size significantly larger than the cross-section of the capacitors 19, the lead portion 24 merging with a guide portion 25 and finally a discharge portion 26. The dimensions of the guide portion 25 are slightly larger than the cross-sectional dimensions of the capacitor and function to guide the capacitors into the discharge portion 26, which latter portion is sized to closely correspond with the cross-sectional dimensions of the capacitors.

In practice, the load plate 22 may be filled by placing the plate beneath a bulk supply of capacitors, the plate being vibrated or reciprocated in a horizontal plane for a period of time during which period capacitors are caused by the vibratory movement to enter into the various throughgoing apertures 23. After a period of oscillation or vibration beneath the bulk supply, the plate 22 is removed and continuously caused to vibrate whereby after a period of time the capacitors will have reached positions wherein one or the other of the end portions 20 or 21 will have progressed at least into the guide portion 25 of the throughgoing apertures 23 of the load plate.

The filled load plate 22 is thereafter superposed over mask 17 in a fixture, which fixture is provided with a back-up plate 27 disposed beneath the mask 17. The fixture is disposed within a loading jig assembly which includes a pusher grid 28 having a plurality of depending pusher rods 29 spaced to register with the apertures 23 of the load plate. The pusher grid 28 is thereafter shifted downwardly so as to force the capacitors 19 out of the load plate 22 and into the apertures 18 of the mask 17.

In FIG. 1 the pusher grid 28 is disclosed as having descended part way downwardly such that the lower terminal ends 21 of the capacitors have been caused to enter part way into the elastomeric mask 17.

In FIG. 2 the grid 28 is shifted to its lowermost position with the result that the capacitors 19 have been advanced into the mask 17 in such manner that the upper and lower ends 20,21 respectively of the capacitors are in substantial coplanar alignment with the upper and lower surfaces 30,31 of the mask 17. Due to the elasticity and deformability of the mask 17 the capacitors will be frictionally retained within the mask in the position noted.

Additionally, the yieldability of the mask enables the capacitors to be forced into the noted position notwithstanding a slightly imperfect alignment of the lower ends 21 of the capacitors with the uppermost ends of the apertures 18. Where such slight misalignment occurs the downward pressure on the capacitors is sufficient to deform the mask whereby the downwardly moving capacitor is forced into the slightly misaligned aperture in the mask.

The filled mask is mounted within the fixture 10 as best illustrated in FIG. 4.

In such mounted position, the side margins of the mask abut against the inner surfaces of the sidewall 14 of base plate 11. Thereafter the upper frame member 12 is clamped over the base plate 11 such that the sidewalls 15 of the frame 12 abut the side margins of the mask 17 above side wall 14, and the lip 16 of the frame overlaps the top surface 30 of the mask adjacent an edge portion thereof.

As conducive to an appreciation of the instant invention, it should be noted that attempts to effect sputtering to the capacitors utilizing a mask and fixtures as generally described above had initially proven unreliable.

As will be understood from the detailed description of the sputtering procedures hereinbelow set forth the sputtering procedure necessitates subjecting the items to be sputtered to vacuum conditions. Initial attempts to employ a sputtering fixture as described resulted in a high incidence of defectively terminated capacitors. Applicants have discovered, after protracted experimentation, that the high failure rate was engendered by the tendency of the elastomeric materials employed, to "out-gas" progressively under vacuum conditions.

As a result of the "out-gasing", a predictable adhesion of the sputtered metal to the exposed electrode layers was not obtained. Instead a multiplicity of glassy inclusions resulted, with concommitent poor adhesion of metal to electrodes, and unpredictability as to the number of electrodes to which good contact was obtained.

Figure 1A:
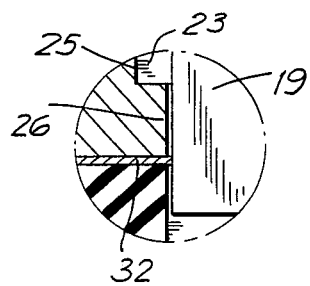
FIG. 1a is a magnified fragmentary view of a portion of the apparatus illustrated in FIG. 1.

The applicants herein have discovered that the "out-gasing" problem could be solved by subjecting the mask 17 prior to loading, to a sputtering step to deposit a thin metallic film over the surfaces 30,31 of the mask. The thickness of the film may be no more than a tenth of a micron or less, and functions to preclude "out-gasing", such that the subsequent sputtering steps could be carried out in a manner whereby a pure metallic lay down covering both the exposed ends of the capacitors and the predeposited film, which is diagrammatically illustrated at 32 in FIG. 1a, would be achieved.

It will be understood that both the upper and lower surfaces 30 and 31 of the mask are subjected to the noted pre-sputtering step, and that after a sputter coating is effected over one of the surfaces 30 the mask is removed from the fixture and inverted so that a subsequent sputtering operation will cover the surface 31 as well as the ends 21 of the capacitors exposed when the mask is inverted.

After both surfaces of the mask and capacitors have been sputtered, the capacitors are removed from the apertures by a pusher grid assembly similar to the grid 28, which grid assembly includes pusher rods which enter into the aligned apertures of the mask and drive the finished capacitors from the apertures 18. It will be noted, that the mask after removal of the capacitors may be refilled and reused without a prior pre-sputtering step, since the mask will include a metal coating comprised of the initial pre-sputtered coating as well as the over sputtering deposited on the surfaces of the mask by the sputtering procedure employed to terminate the capacitors. The noted mask may be reused time and time again until the coating or build up on the surface of the mask renders the mask unduly stiff or resistant to deformation, following which it is merely necessary to chemically remove the metallic build-up from the surfaces of the mask, subject the mask to a further pre-sputtering step, and thereafter repeat the cycle.

Figure 5:
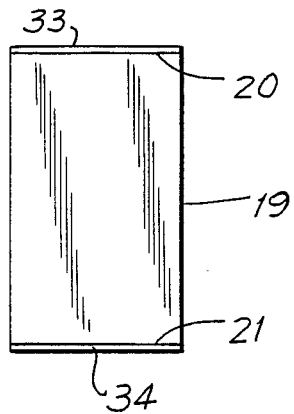
FIG. 5 is a side elevational view of a sputter terminated capacitor.

There is shown in FIG. 5 a finished capacitor 19 to the upper and lower surfaces 20 and 21 of which have been applied metallic layers 33,34 respectively. Lead members may be soldered to the terminations 33,34 by any of a number of conventional procedures.

Figure 6:
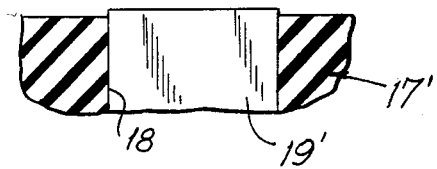
FIG. 6 is a fragmentary view of a capacitor mounted in a mask in accordance with an embodiment of the invention.
Figure 7:
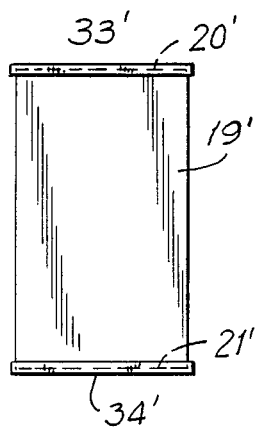
FIG. 7 is a terminated capacitor formed in accordance with the embodiment shown in FIG. 6.

In FIG. 7 there is shown a capacitor similar to that shown in FIG. 5, the capacitor of FIG. 7 differing from that of FIG. 5 in that the termination portions 33',34' cover not only the ends 20',21' of the capacitor 19', but also extend slightly along the side margins of the capacitor. The embodiment of FIG. 7 is fabricated by loading the capacitors 19' into a mask 17' in such manner that the upper and lower surfaces (only the upper surface being shown in FIG. 6) project slightly beyond the upper and lower margins of the mask 17'. This condition is achieved by utilizing a mask of slightly lesser thickness than the total lengthwise dimension of the capacitors, and by introducing a slightly compressible layer between the undersurface of the mask 17' and load plate 27. Under such circumstances, the pusher rods 29 will force the lower ends of capacitors 19' through the body of the mask 17' in such manner that they indent slightly into the compressible layer, whereby both ends of the capacitors will project slightly above and below the upper and lower surfaces of the mask 17'.

There will next be described by way of example and without limitation a preferred sputtering procedure. Prior to loading, the capacitors are cleaned utilizing a conventional freon type degreasing compound and are thermally etched for approximately an hour at 810° C. The loaded and precoated fixtures described are sputter coated by passing the same beneath the target of a sputtering device. Optionally, but preferably, an in-line sputtering system such as a system identified as the SERIES 900 SPUTTERING DEVICE as manufactured by MATERIALS RESEARCH CORPORATION of Orangeberg, N.Y., may be employed.

An in-line sputtering system is preferred in that it permits the fixtures to be progressively advanced beneath target areas of different compositions whereby a layer of a first sputter deposited material may be formed directly over the exposed surface and thereafter a second and if desired a third layer applied. Desirably, a thin chromium layer may be applied and thereafter a nickel or nickel vanadium layer and a final silver or palladium layer.

To complete the sputtering procedure, the fixture is placed in a vacuum load lock which is pumped to a pressure of less than $50 \times 10^{-5}$ tor and thereafter introduced into the main sputtering chamber.

Sputtering may be effected at a power level of 4.2 kilowats and scan speed of approximately 10 milimeters per second across the target area. Sputtering is performed preferably in an argon gas environment at a pressure of $10 \times 10^{-5}$ tor. Where a chromium substrate is used for a high adhesion layer, thicknesses in the range of 0.02 to 0.05 micrometers are preferred. A nickel coating of from 0.12 to 0.5 micrometers has been found to be optimum. Where a silver or palladium overcoating is to be employed a coating thickness of 0.1 micron has been found sufficent.

The precoating of the surfaces of mask 17 may be effected using a chromium target material, the coating thickness being non-critical, but being initially in the range of about 0.15 micrometers. As previously noted, the initial chromium presputter coating will be oversputtered in the course of treating capacitors and thus will increase significantly in thickness after being used for a series of capacitor sputtering cycles.

From the foregoing, it will be apparent that there is shown and described a method for the effective termination of capacitors of the MLC type whereby a multiplicity of capacitors may be simultaneously and effectively treated. By way of example and without limitation a mask of 4 inches by 4 inches may carry over 13 hundred capacitors for simultaneous treatment.

From the foregoing, it will be appreciate by those skilled in the art that there is shown and described a method of effectively terminating MLC's by a sputtering procedure, which procedure includes the step of loading the capacitors into apertures formed in a elastomeric mask the surfaces of which mask have been presputtered to prevent "out-gasing". Numerous variations of the described procedure may readily occur to those skilled in the art who have been made familiar with the instant disclosure.

Accordingly, the invention is to be broadly construed within the scope of the appended claims.

Having thus described the invention and illustrated its use, what is claimed as new and is desired to be secured by Letters Patent in the United States is:

1. The method of applying conductive coatings to opposite ends of a multiplicity of ceramic bodies which comprises the steps of providing a resilient elastomeric mask having opposed parallel faces, said mask having a multiplicity of throughgoing apertures extending perpendicularly between said faces, subjecting said opposed faces of said mask to a metal sputtering step to thereby cause a metallic coating to be formed over said opposed faces, introducing into said apertures of said coated mask a multiplicity of said ceramic bodies to thereby expose end regions of said bodies at opposite faces of said mask, areas of said bodies between said end regions being shielded by said mask, subjecting said filled mask to further metal sputtering steps to thereby deposit a metallic film on said end regions and on said firs applied coating of said mask and thereafter removing said ceramic bodies from said mask.

2. The method in accordance with claim 1 and including the step of stretching said mask in the direction of the plane of said parallel faces to thereby enlarge said apertures while introducing said ceramic bodies into said apertures, and releasing said mask from said stretched condition after said bodies are introduced into said apertures and before performing said further sputtering steps.

3. The method in accordance with claim 2 wherein the thickness of the coating applied to said mask is sufficiently small to not materially reduce the resilience of said mask.

4. The method in accordance with claim 1 wherein said ceramic bodies comprise capacitors having mutually spaced electrodes exposed at said end regions, and said coating formed by said further sputtering step forms a conductive layer electrically connecting said electrodes at each of the respective end regions.

5. The method in accordance with claim 4 and including the step of inserting said capacitors into said mask in such manner that increments of said capacitors project beyond said opposed faces of said mask, and continuing said sputtering step for a time sufficient to form circumferential conductive lands on the projecting portions of said capacitors.

* * * * *